(12) United States Patent
Bunce et al.

(10) Patent No.: US 9,997,218 B2
(45) Date of Patent: *Jun. 12, 2018

(54) DUAL MODE OPERATION HAVING POWER SAVING AND ACTIVE MODES IN A STACKED CIRCUIT TOPOLOGY WITH LOGIC PRESERVATION

(71) Applicant: INTERNATIONAL BUSINESS MACHINES CORPORATION, Armonk, NY (US)

(72) Inventors: Paul A. Bunce, Poughkeepsie, NY (US); Yuen H. Chan, Poughkeepsie, NY (US); John D. Davis, Maybrook, NY (US); Silke Penth, Holzgerlingen (DE); David E. Schmitt, Rochester, MN (US); Tobias Werner, Weil im Schoenbuch (DE); Brian J. Yavoich, Highland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/711,135

(22) Filed: Sep. 21, 2017

(65) Prior Publication Data

US 2018/0005674 A1 Jan. 4, 2018

Related U.S. Application Data

(63) Continuation of application No. 15/051,733, filed on Feb. 24, 2016, now Pat. No. 9,786,339.

(51) Int. Cl.
*G11C 7/12* (2006.01)
*G11C 11/4094* (2006.01)
(Continued)

(52) U.S. Cl.
CPC ............ *G11C 7/12* (2013.01); *G11C 11/4094* (2013.01); *G11C 5/145* (2013.01); *G11C 5/147* (2013.01);
(Continued)

(58) Field of Classification Search
CPC ....... G11C 7/12; G11C 11/4094; G11C 5/147; G11C 11/4074; G11C 5/145; G11C 5/148
(Continued)

(56) References Cited

U.S. PATENT DOCUMENTS 6,169,419 B1  1/2001  De et al.
7,151,696 B2  12/2006  Suh et al.
(Continued)

OTHER PUBLICATIONS

List of IBM Patents or Patent Applictions Treated as Related; (Appendix P), Filed Dec. 12, 2017, 2 pages.

*Primary Examiner* — David Lam
(74) *Attorney, Agent, or Firm* — Cantor Colburn LLP; Margaret A. McNamara

(57) ABSTRACT

A system for dual mode operation having power saving and active modes in a stacked circuit topology having logic preservation is provided. The system includes a pre-charge circuit and a sleep mode control circuit for providing a signal to disable a plurality of circuit elements and switching a mode of the system, the sleep mode control circuit being coupled to the pre-charge circuit and further being coupled to a logic function circuit, wherein the plurality of circuit elements comprise logic gates and transistor devices. The system also includes a keeper circuit coupled to the global bitline, and the logic function circuit coupled to a solar bitline, wherein the logic function circuit preserves a state of the solar bitline, the state of the global bitline determines the state of the solar bitline. The system includes an effective pull-up transistor coupled to the sleep mode control circuit and the logic function circuit.

1 Claim, 5 Drawing Sheets

(51) Int. Cl.
*G11C 11/4074* (2006.01)
*G11C 5/14* (2006.01)

(52) U.S. Cl.
CPC .......... *G11C 5/148* (2013.01); *G11C 11/4074* (2013.01)

(58) Field of Classification Search
USPC .................... 365/189.11, 203, 226, 227, 229
See application file for complete search history.

(56) References Cited

U.S. PATENT DOCUMENTS

| | | | | |
|---|---|---|---|---|
| 9,030,893 | B2* | 5/2015 | Jung | ........................ G11C 7/12 365/154 |
| 9,786,339 | B2 | 10/2017 | Bunce et al. | |
| 2009/0175107 | A1 | 7/2009 | Christensen et al. | |

* cited by examiner

DUAL MODE OPERATION HAVING POWER SAVING AND ACTIVE MODES IN A STACKED CIRCUIT TOPOLOGY WITH LOGIC PRESERVATION

DOMESTIC PRIORITY

This application is a continuation of U.S. patent application Ser. No. 15/051,733, filed Feb. 24, 2016, the content of which is incorporated by reference herein in its entirety.

BACKGROUND

The present disclosure relates to semiconductor circuit topology, and more specifically, to a dual mode operation having power saving and active modes in a stacked circuit topology.

In a semiconductor circuit that is rarely switching, leakage power must be addressed. Stacking PFET (p-type field effect transistor) or NFET (n-type field effect transistor) devices in series leads to a significant reduction in leakage power when these devices are in a standby state. However, for the circuit to maintain the same effective drive strength, the size of the devices in the stack must be increased which results in an increased load of the critical path. In critical paths, an increase in load can severely degrade performance as high performance devices must be capable of efficiently switching states with minimal delay.

SUMMARY

In accordance with embodiments of the invention, a system, circuit and method for dual mode operation having power saving and active modes in a stacked circuit topology having logic preservation are provided. The system includes a pre-charge circuit for pre-charging a global bitline to restore the global bitline, wherein the global bitline is initialized to a high state, and a sleep mode control circuit for providing a signal to disable a plurality of circuit elements and switch a mode of the system, the sleep mode control circuit being coupled to the pre-charge circuit and further being coupled to a logic function circuit, wherein the plurality of circuit elements comprise logic gates and transistor devices. The system also includes a keeper circuit coupled to the global bitline, wherein the keeper circuit provides feedback to maintain a state of the global bitline, and the logic function circuit coupled to a solar bitline, wherein the logic function circuit preserves a state of the solar bitline, the state of the global bitline determines the state of the solar bitline. The system includes an effective pull-up transistor coupled to the sleep mode control circuit and the logic function circuit, wherein a gate of the effective pull-up transistor is coupled to the sleep mode control circuit and a drain of the effective pull-up transistor is coupled to the logic function circuit.

These and other benefits and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

A circuit topology offering two modes of operation is provided in order to decrease leakage power, improve performance, and maintain logical function by eliminating floating nets within the circuit topology. In an exemplary embodiment, a circuit topology is provided that functions in two different modes of operation. A first standby mode is a slow speed, a low current mode that maintains logic function during sleep mode where there is no switching. During the standby mode, the circuit elements are holding logic levels. A second mode is a high speed active mode that enables high performance through the critical path when the sleep mode is not enabled. In both modes, full logic levels are maintained to preserve the states of the critical bitlines in the system. The circuit topology includes stacked transistor devices that are configured to reduce current leakage.

In one embodiment, a sleep signal from a sleep mode control circuit is utilized to enable/disable a plurality of circuit elements, including transistor devices and logic gates. The sleep signal is further configured to switch a large transistor device. The placement of the large transistor in the circuit allows the extra capacitive load introduced from the stacking of transistor devices in the circuit to be moved from the time critical bitline to a non-time critical node allowing for increased performance of the critical bitline. In an exemplary embodiment, the node comprises a bitline, signal, or net. Timing sensitive paths or bitlines directly affect the performance of the circuit and have delay and latency requirements. In another exemplary embodiment, the logic function is maintained when the sleep mode is enabled using two transistors of the stacked transistors in the logic function circuit that are configured to be a smaller size to reduce the load on the critical bitline.

In an exemplary embodiment, a pre-charge node provides a source for the pre-charge circuit and the pre-charge circuit elements are stacked to reduce the power leakage. The stacking of these elements can increase the load of the pre-charge node thereby reducing the performance of the circuit. In an exemplary embodiment, the top of the stacked transistors is removed from the pre-charge circuit path and located on a path driven by the sleep mode control circuit. An added benefit can be the reduction in the load on the critical pre-charge circuit path. In addition, the sleep circuit is not time critical therefore the load added to the sleep mode control circuit is not adversely affected.

Figure 1:
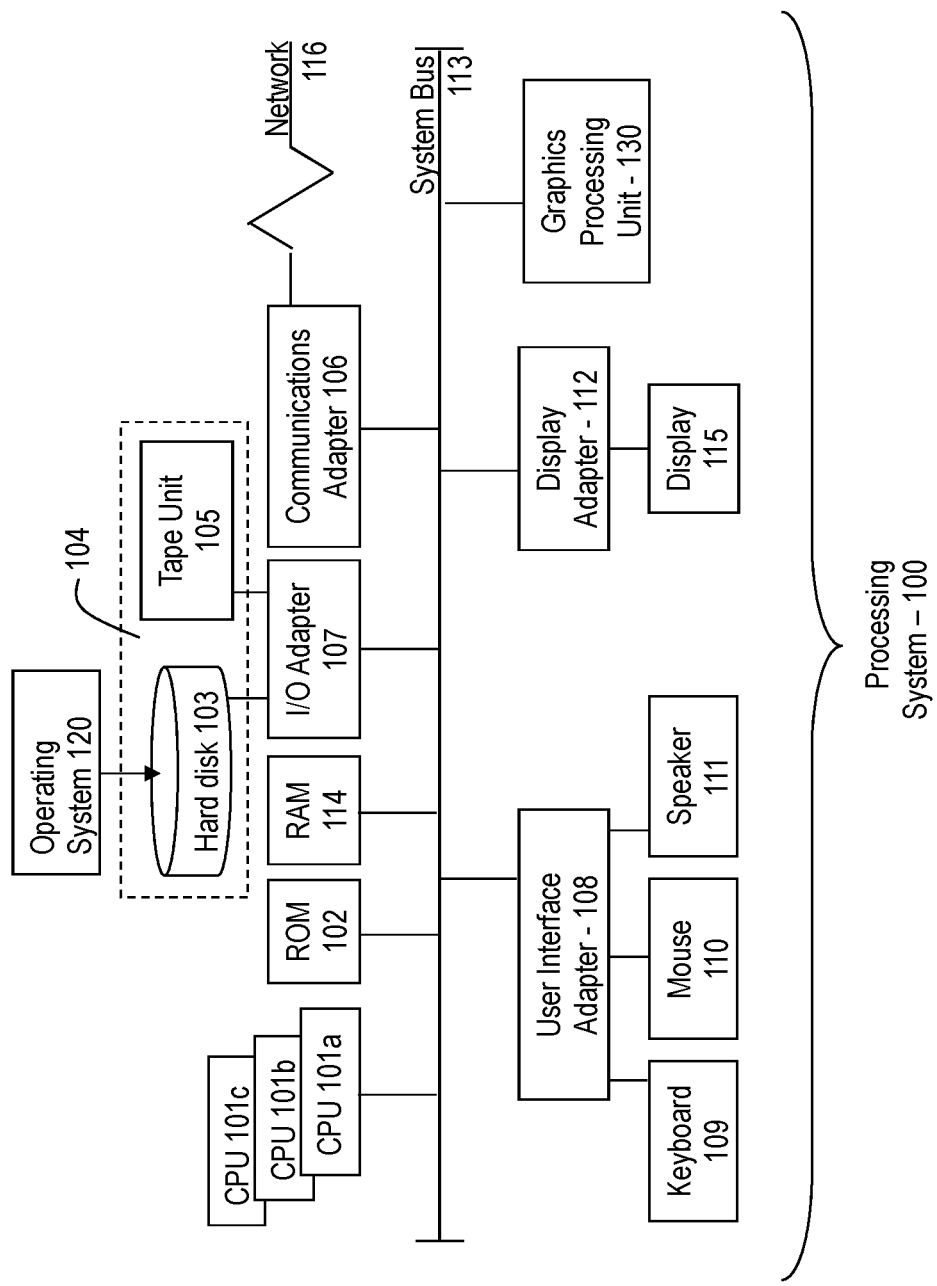
FIG. 1 is a block diagram illustrating one example of a processing system for practice of the teachings herein.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1. The system 100 can be implemented to perform the method for implementing a dual mode power saving stacked circuit topology with logic preservation.

Figure 2:
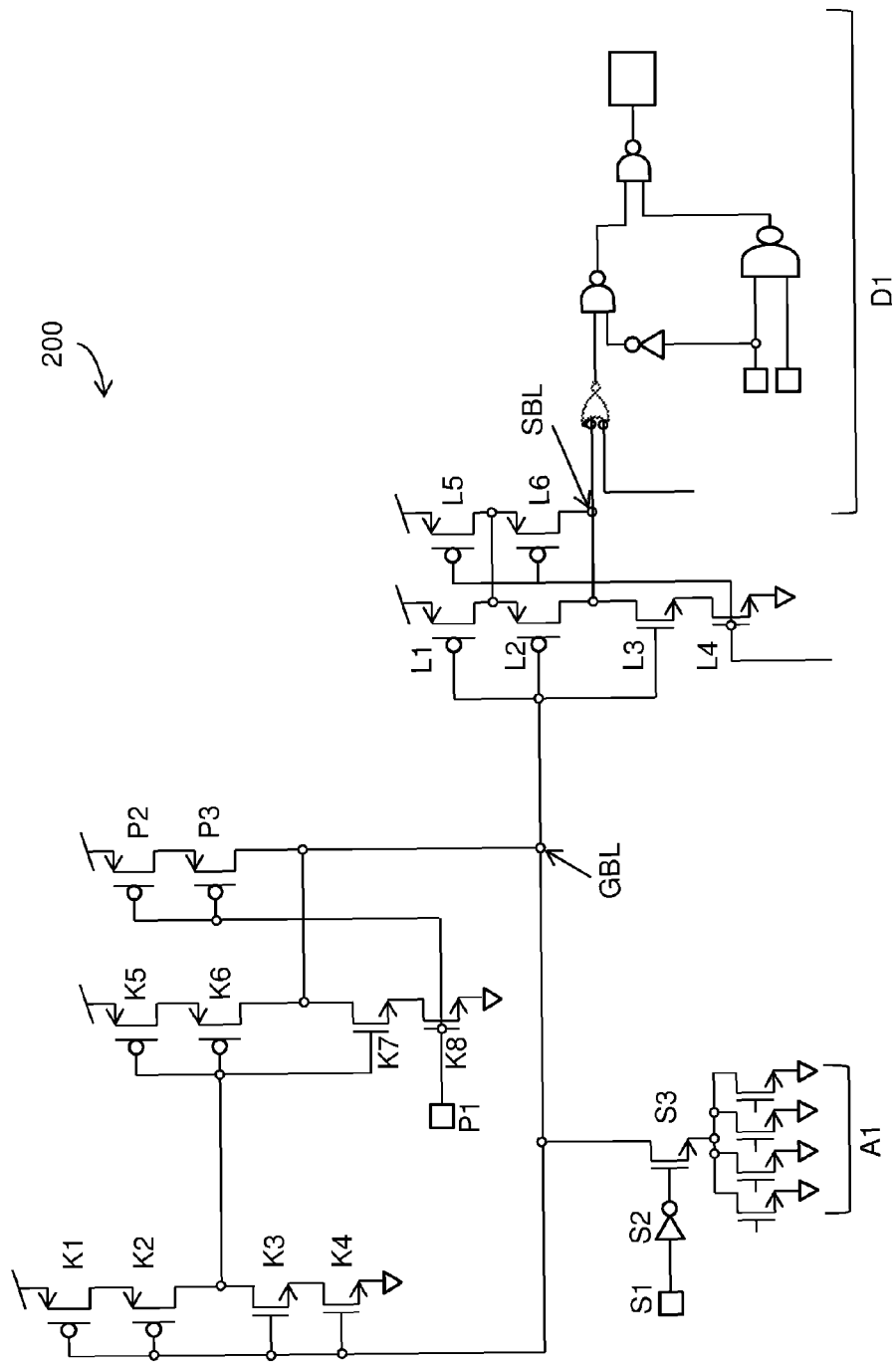
FIG. 2 is a block diagram illustrating a configuration for dual mode operation having power saving and active modes in a stacked circuit topology in accordance with one or more embodiments.

Referring now to FIG. 2, a dual mode operation having power saving and active modes in a stacked circuit topology 200 is generally shown in accordance with an embodiment. The circuit topology includes a pre-charge circuit, keeper circuit, sleep mode control circuit, and a logic function circuit. The pre-charge circuit includes elements P1-P3, where the element P1 is the pre-charge node and elements P2, P3 are PFET transistors. Sleep mode control circuit includes elements S1-S3 and a circuit array A1 comprising multiple elements. The element S1 is a sleep mode control node, S2 is an inverter, and S3 is an NFET transistor. The keeper circuit includes elements K1-K8. Logic function circuit includes elements L1-L6. The circuit D1 represents an exemplary downstream circuit.

FIG. 2 shows a topology 200 including a pre-charge circuit that includes elements P1-P3. The pre-charge circuit is provided to pre-charge the global bitline (GBL) to a high state "1" at the beginning of a cycle. The pre-charge circuit includes the pre-charge node P1 which supplies the power to the gate of circuit elements P2, P3. In an exemplary embodiment the circuit elements P2, P3 are PFETs. The pre-charge circuit is a time critical path and must be able to respond to the pre-charge signal to affect the global bitline with minimal delays. When pre-charge node P1 is supplying a low signal, the transistors P2, P3 pull-up the global bitline. When the pre-charge node supplies a high signal, the transistors P2, P3 are switched off; however during this state the keeper circuit K1-K8 is capable of holding the present state of the global bitline.

The topology 200 also includes a sleep mode control circuit including elements S1-S3 and the sleep mode control circuit is coupled to a plurality of circuit elements A1 through devices S2 and S3. The sleep mode control circuit transmits a signal from the sleep control node S1 to enable or disable a sleep mode of the system. Inverter S2, which is coupled to the sleep control node S1, receives the sleep signal and provides the signal to the NFET S3, which is coupled to the plurality of circuit elements A1. In an exemplary embodiment, the plurality of circuit elements (S2, S3, A1) serve to couple an array of memory cells to the global bitline during an active mode. During a memory cell read, the data from the memory cells can be passed to the global bitline by activating one of the plurality of circuit elements A1. The active circuit element can drive the global bitline to a low value. When the sleep signal is 0, the mode of the system is in an active mode, and when the sleep mode signal is 1, the mode of the system is in a sleep mode.

The topology 200 as shown in FIG. 2 further includes a keeper circuit including devices K1-K8. The keeper circuit is coupled to the global bitline in order to provide feedback to the global bitline to hold the state of the global bitline when the pre-charge signal (driving the gate of one of the A1 circuit elements) is no longer being applied. The elements of the keeper circuit include a plurality of NFETs (K3, K4, K7, K8) and a plurality PFETs (K1, K2, K5, K6). The transistors of the keeper circuit can be configured to be strong enough to resist noise and leakage that would otherwise cause the global bitline to errantly discharge to a low value or high value. In exemplary embodiments, the transistor devices are sized to prevent an errant charge and/or discharge. At the same time, however, the transistor devices should be weak enough to allow the node to quickly charge and discharge when required to do so.

The topology 200 also includes a logic function circuit including elements L1-L6. In an exemplary embodiment, the transistors L1, L2, L5, and L6 are PFETs and transistors L3, L4 are NFETs which are connected in a NAND gate configuration. The transistors in the logic function circuit can be stacked in order to reduce potential power leakage. However, the additional transistors in the stack create an additional load on the global bitline. The output of the NAND configuration is further coupled to a solar bitline (SBL). In this particular configuration, transistors L1, L2, L5, and L6 are tasked with pulling up the solar bitline. The output of the solar bitline is coupled to a downstream circuit D1.

In the configuration of topology 200 shown in FIG. 2, the transistor elements have been stacked in order to provide power leakage reduction. While the stacked PFETs (L1, L5) in the NAND configuration of the logic function circuit help reduce power leakage, the additional stacked transistors add a significant load to the global bitline. Similarly, the stacked PFETs (P2, P3) in the pre-charge circuit which drives the global bitline also reduce the leakage, but also add significant load to the pre-charge node. Both of the global bitline and pre-charge paths are time critical paths and the added load can directly degrade the performance of the topology.

Figure 3:
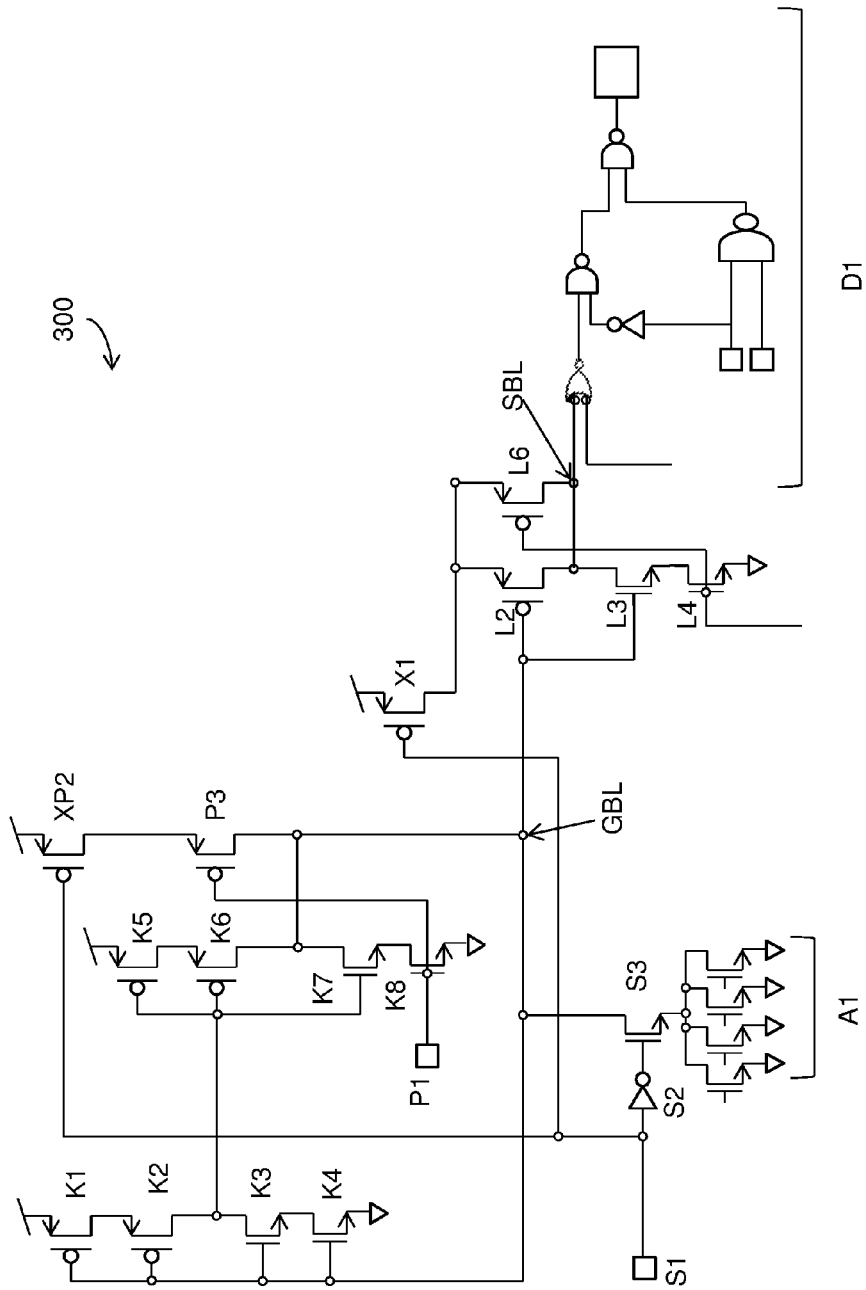
FIG. 3 is a block diagram illustrating a configuration for dual mode operation having power saving and active modes in a stacked circuit topology in accordance with one or more embodiments.

Referring now to FIG. 3 a topology 300 is shown. The topology 300 includes a pre-charge circuit, keeper circuit; sleep mode control circuit, logic function circuit and downstream circuit D1 as similarly shown in FIG. 2. The pre-charge circuit includes elements P1-P3. The sleep mode control circuit includes elements S1-S3 and is coupled to a plurality of circuit elements A1. The sleep mode control circuit is further coupled to transistors X1 and XP2. The keeper circuit includes elements K1-K8 and the logic function circuit includes elements L2-L4 and L6. Downstream circuit D1 represents a further downstream circuit.

Topology 300 is configured with the sleep mode control circuit being coupled to a gate of effective pull-up transistor X1 and further coupled to the gate of transistor XP2. The effective pull-up transistor X1 is also coupled to transistors L2, L6. When the sleep mode is not enabled, the solar bitline can be pulled high through the effective pull-up transistor X1. However when the sleep mode is enabled, the effective pull-up transistor X1 is switched off and does not provide a path to the high rail.

The configuration of FIG. 3 has the benefit of reducing the load on the pre-charge circuit, as the pre-charge circuit no longer has to drive both of the stacked transistors XP2 and P3. The gate of transistor XP2 is coupled and driven by the sleep mode control circuit. Logic preservation is not required for transistor devices XP2 and P3 when the sleep mode is enabled because node P1 is in a high state which keeps P3 in the off state. Reducing the load of the pre-charge circuit increases the performance of the pre-charge circuit path.

Figure 4:
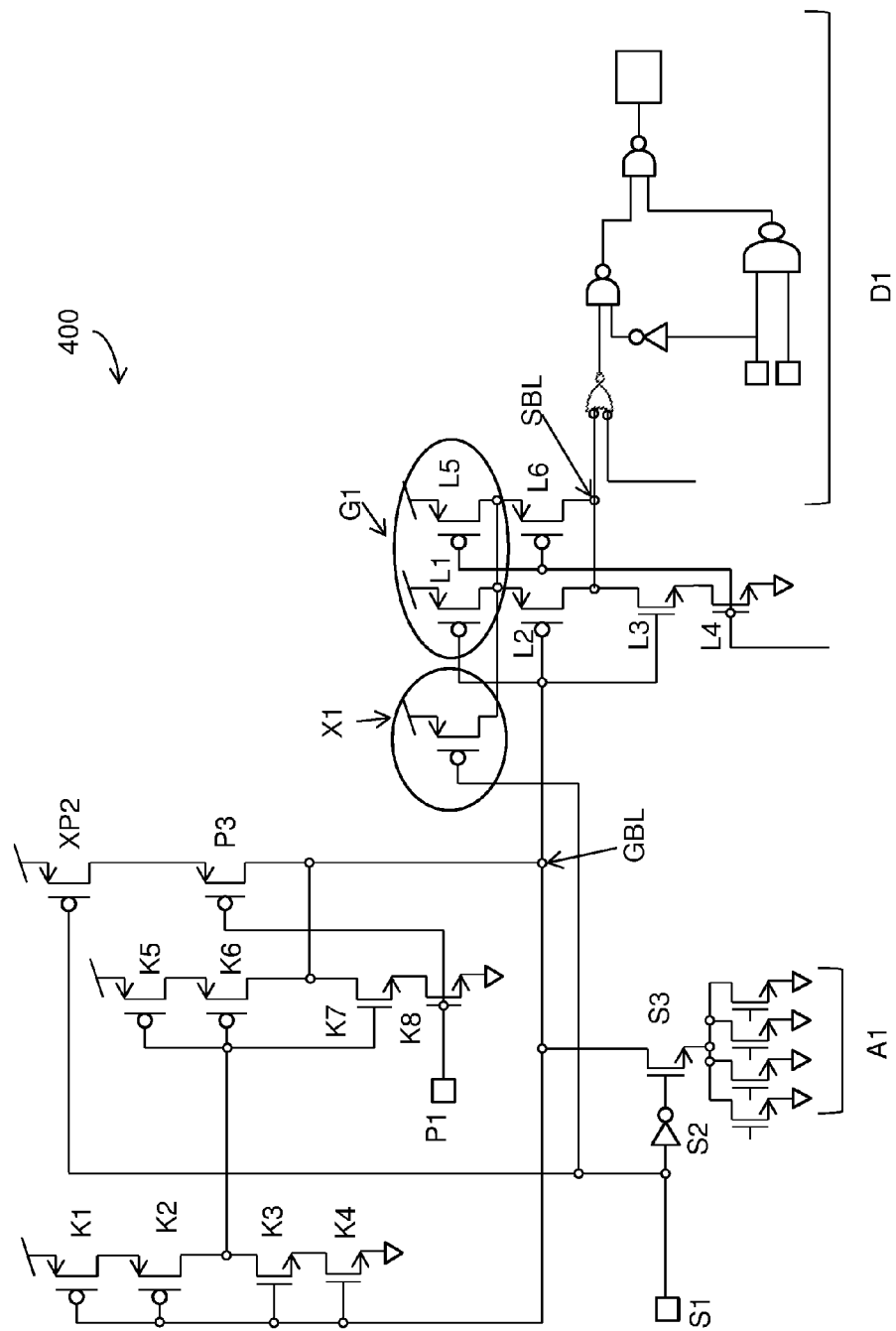
FIG. 4 is a block diagram illustration another configuration for dual mode operation having power saving and active modes in a stacked circuit topology having logic preservation in accordance with one or more embodiments.

Referring now to FIG. 4, a topology 400 is generally shown in accordance with an exemplary embodiment. The topology 400 includes a pre-charge circuit, keeper circuit; sleep mode control circuit, logic function circuit and downstream circuit D1 as similarly shown in FIG. 3. The pre-charge circuit includes elements P1-P3. The sleep mode control circuit includes elements S1-S3 and is coupled to a plurality of circuit elements A1. The keeper circuit includes elements K1-K8 and the logic function circuit includes elements L1-L6. Downstream circuit D1 represents a further downstream circuit.

The circuit topology 400 shown in FIG. 4 provides several performance benefits over other existing circuit topologies known in the art. The topology 400 can reduce the load on the pre-charge circuit, and can preserve a logic state when the sleep mode is enabled. This can result in a decrease in the load on the performance path to allow for faster switching.

As shown in FIG. 4, the load of the pre-charge circuit has been reduced and the pre-charge node P1 no longer has to supply power to both transistors P2 and P3 as in FIG. 2 in order to pre-charge the global bitline. The pre-charge node P1 supplies power to transistor P3 and the sleep mode control node S1 of the sleep mode control circuit supplies the power to transistor XP2. This configuration maintains the stacked topology to reduce power leakage while simultaneously reducing the load on the pre-charge circuit, where the pre-charge circuit comprises the pre-charge signal, signal path, node, and net.

FIG. 4 further illustrates the drain of effective pull-up PFET X1 has been coupled to the logic function circuit and the gate of the effective pull-up PFET X1 is coupled to the sleep mode control circuit. In an embodiment, the effective pull-up PFET X1 is a large PFET when compared to the PFETs L1 and L5. PFET X1 must provide enough drive strength to affect the solar bitline. The stacked PFETs include transistors L1 and L5 and can be reduced in size while maintaining the ability to hold the solar bitline at a high state when the sleep mode is enabled.

Specifically, when the sleep mode is enabled, the global bitline is not in a switching state and transistors in group G1 maintain the state of the solar bitline when one of the global bitline inputs to the logic function circuits is low. Without the transistors G1, the state of the solar bitline would not be held high when the sleep mode is enabled. Therefore, the transistors G1 are configured to preserve the state of the solar bitline during the sleep mode. If G1 is not present, the global bitline would no longer be able to hold the solar bitline high.

In an exemplary embodiment, the "large" PFET can be two to four times the size of transistors L2 and L6. In other embodiments, the large PFET can be a size greater than one times the size of transistors L2 and L6. In another embodiment, the large PFET can be made larger or smaller in order to ensure the performance of the circuit topology is not substantially degraded. The tradeoff between performance and power savings must be balanced. As the devices/transistors become larger, the performance increases but at the cost of increased power consumption. In an embodiment, the small devices G1 can be configured to be a minimum size to maintain the state of the solar bitline.

Without the stack G1 of transistors, the solar bitline could possibly float to any value. The stack G1 no longer has to provide pull-up on the solar bitline but only needs to be strong enough to hold the SBL state. When the sleep mode is not enabled, the pull-up on the solar bitline is provided by the effective pull-up PFET X1. Additionally, the effective pull-up PFET X1 only loads down the non-critical sleep signal path so there is no additional load on the global bitline. This arrangement reduces the load on the global bitline and improves the performance while reducing power leakage.

In an exemplary embodiment, a second effective pull-up PFET can be substituted for transistor P2 of FIG. 2. In this configuration, the load is transferred from the pre-charge signal path to the non-critical sleep signal path. In another embodiment, the equivalent of smaller PFETs L1 and L5 are not required when the PFET XP2 is substituted with a large PFET because pre-charge node P1 is not active when the sleep mode is enabled. The state of the global bitline (either 0 or 1) is maintained by the keeper circuit. Although the configuration of the topology 400 adds an extra load to the sleep mode control circuit, the performance of the system is not adversely affected as the sleep mode control circuit path is a non-timing critical signal path.

Figure 5:
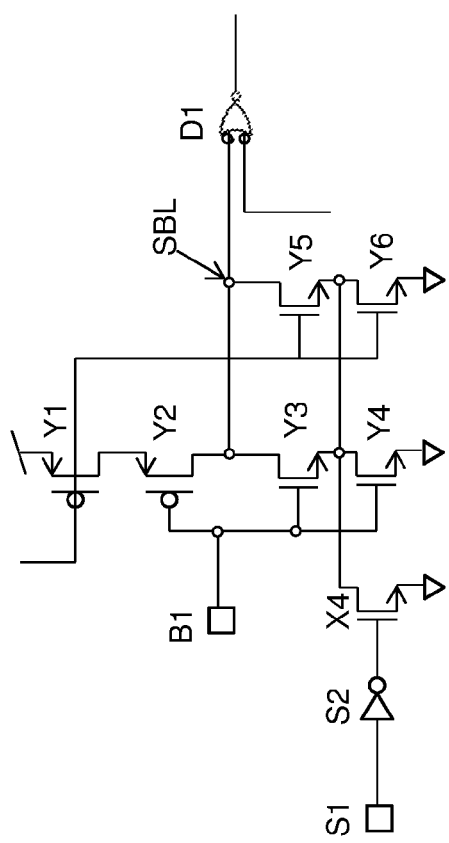
FIG. 5 is a block diagram illustrating an alternative embodiment for dual mode operation having power saving and active modes in a stacked circuit topology having logic preservation.

FIG. 5 depicts an alternative embodiment implementing a NOR circuit configuration 500, whereas in FIG. 3 a NAND circuit configuration (elements L1-L6) was implemented. In this particular embodiment, the topology is initialized to the low state and the NOR circuit including elements Y1-Y6 are coupled to the gate of an effective pull-down transistor X4 and is further coupled to a downstream circuit D1. Node B1 represents the global bitline of the circuit. In this particular embodiment, the effective pull-down transistor is an NFET, however, it is known to one of ordinary skill in the art that any transistor type device or a combination of devices can be substituted for the elements of the topology. Similar to the configuration in FIG. 3, the effective pull-down transistor X4 is coupled to the sleep mode control circuit which enables the stacked transistors Y4 and Y6 to be reduced in size. In an exemplary embodiment, the effective pull-down transistor X4 is larger than the stacked transistors Y4 and Y6. These smaller transistor devices hold the solar bitline (SBL) low when the sleep mode is enabled. The large effective pull-down transistor X4 provides strong pull-down drive for high speed operation when a sleep mode is not enabled. In another embodiment, the logic circuit can be any logic circuit known to one of ordinary skill in the art, not limited to NAND or NOR logic circuits but include inverters and/or a combination of other logic components. In other embodiments, various configurations can be utilized to benefit serially connected logic gates.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), dynamic random access memory (DRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed:

1. A system for dual mode power saving in a stacked circuit topology having logic preservation, comprising:
   a memory;
   a processor being coupled to the memory;
   a pre-charge circuit for pre-charging a global bitline to enable switching of the global bitline;
   a sleep mode control circuit for providing a signal to disable an array of circuit elements and switch a mode of the system, the sleep mode control circuit being coupled to the pre-charge circuit and further being coupled to a logic function circuit;
   a keeper circuit coupled to the global bitline;
   the logic function circuit coupled to a local bitline (solar bitline); and
   an effective pull-up transistor coupled to the sleep mode control circuit and the logic function circuit, wherein the logic function circuit comprises at least two stacked transistors to pull-up the local bitline (solar bitline) based on a received signal from the sleep mode control circuit, wherein the two stacked transistors are p-type field-effect transistors (PFET), wherein the two stacked transistors are smaller than the effective pull-up transistor.

* * * * *